(12) United States Patent
Okamoto et al.

(10) Patent No.: US 6,784,719 B2
(45) Date of Patent: Aug. 31, 2004

(54) LEVEL SHIFT CIRCUIT FOR TRANSMITTING SIGNAL FROM LEADING EDGE TO TRAILING EDGE OF INPUT SIGNAL

(75) Inventors: Ryuta Okamoto, Yokohama (JP); Kyoichi Takenaka, Yokohama (JP); Akihiko Yoshizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/321,640

(22) Filed: Dec. 18, 2002

(65) Prior Publication Data

US 2003/0137336 A1 Jul. 24, 2003

(30) Foreign Application Priority Data

Dec. 19, 2001 (JP) ........................................ P2001-386703

(51) Int. Cl.[7] .................................................. H03L 5/00
(52) U.S. Cl. ............................. 327/333; 326/87; 326/81
(58) Field of Search ................................. 327/333, 306, 327/427, 437; 326/87, 76, 80, 81, 60

(56) References Cited

U.S. PATENT DOCUMENTS

| | | | |
|---|---|---|---|
| 5,486,785 A | | 1/1996 | Blankenship ................ 327/306 |
| 5,498,980 A | * | 3/1996 | Bowles ......................... 326/60 |
| 5,914,624 A | | 6/1999 | Son ............................. 327/364 |
| 5,952,868 A | | 9/1999 | Gowni et al. ................ 327/362 |
| 6,025,738 A | | 2/2000 | Masleid ....................... 326/83 |
| 6,163,170 A | * | 12/2000 | Takinomi ..................... 326/81 |
| 6,229,365 B1 | * | 5/2001 | Iketani et al. ............... 327/170 |
| 6,323,738 B1 | | 11/2001 | Yoshizawa et al. ........... 331/57 |
| 6,566,932 B2 | * | 5/2003 | Yoon .......................... 327/333 |

FOREIGN PATENT DOCUMENTS

JP  8-330939  12/1996

* cited by examiner

*Primary Examiner*—Dinh T. Le
(74) *Attorney, Agent, or Firm*—Oblon, Spivak, McClelland, Maier & Neustadt, P.C.

(57) ABSTRACT

A level shift circuit encompasses a first transmission circuit configured to transmit a leading edge of an input signal, a second transmission circuit configured to transmit a trailing edge of the input signal, and a composite circuit configured to generate an output signal by synthesizing the leading edge and the trailing edge.

20 Claims, 11 Drawing Sheets

US 6,784,719 B2

LEVEL SHIFT CIRCUIT FOR TRANSMITTING SIGNAL FROM LEADING EDGE TO TRAILING EDGE OF INPUT SIGNAL

CROSS REFERENCE TO RELATED APPLICATIONS

This application is based upon and claims the benefit of priority from the prior Japanese Patent Applications No. P2001-386703, filed on Dec. 19, 2001; the entire contents of which are incorporated herein by reference.

BACKGROUND OF THE INVENTION

1. Field of the Invention

The present invention relates to a level shift circuit converting a signal level between two circuits supplied by different power sources respectively.

2. Description of the Related Art

A level shift circuit 200 shown in FIG. 1A is used to convert a signal of amplitude Va received from a circuit 201 to a signal of amplitude Vb supplied to a circuit 204. The level shift circuit 200 consists of an inverter 202, and an inverter 203 having an input terminal connected to an output terminal of the inverter 202. The voltage Va is supplied to the circuit 201 and to the inverter 202 from a power source VCC1. The voltage Vb is supplied to the inverter 203 and to the circuit 204 from a power source VCC2.

When the voltage of an input signal Vin transmitted from the circuit 201 becomes larger than a threshold voltage Vth(a) of the inverter 202, the output voltage V1 of the inverter 202 starts increasing. When the output voltage V1 of the inverter 202 becomes smaller than a threshold voltage Vth(b) of the inverter 203, the output signal Vout supplied from an output terminal of the inverter 203 starts increasing. The output signal Vout is supplied to the circuit 204. However, the threshold voltage Vth(b) of the inverter 203 is different from the threshold voltage Vth(a) of the inverter 202, because the inverters 202 and 203 are supplied with different voltages Va and Vb. In other words, a trailing edge of the output signal Vout is delayed, because the threshold voltage Vth(b) is different from the threshold voltage Vth(a). As shown in FIG. 1B, a low level period TBoff of the output signal Vout is longer than a high level period TBon. In other words, a duty of the output signal Vout is different from a duty of the input signal Vin.

SUMMARY OF THE INVENTION

In a aspect of the present invention, a level shift circuit encompasses a first transmission circuit configured to transmit a leading edge of an input signal, a second transmission circuit configured to transmit a trailing edge of the input signal, and a composite circuit configured to generate an output signal by synthesizing the leading edge and the trailing edge.

DETAILED DESCRIPTION OF THE INVENTION

Figure 1A:
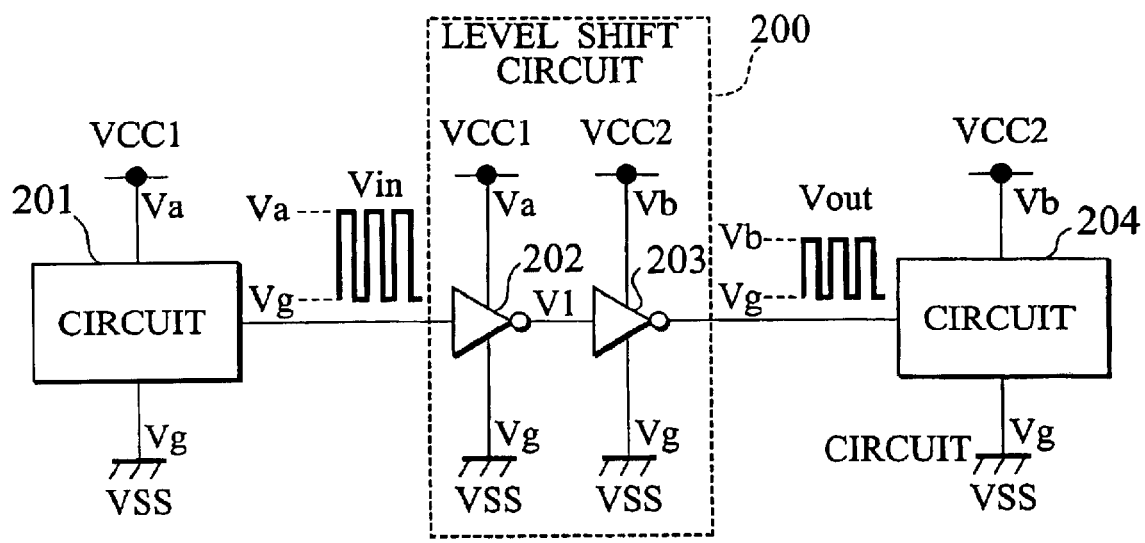
FIG. 1A is a circuit diagram of a level shift circuit according to a related art.
Figure 1B:
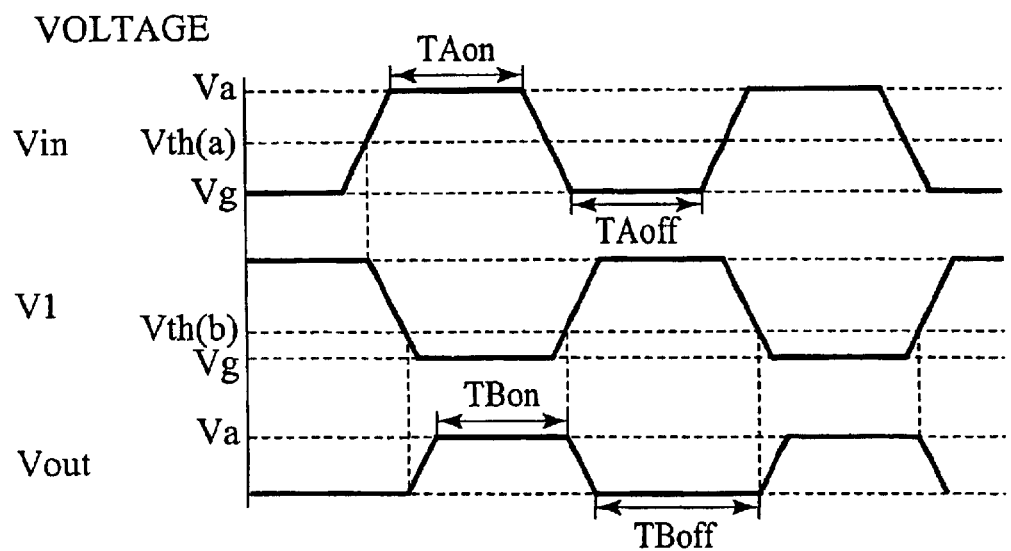
FIG. 1B is a diagram for describing an operational timing of a level shift circuit according to the related art.

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail. In the following description, the word "connect" defines a state in which first and second elements are electrically connected to each other without regard to whether or not there is a physical connection between the elements.

First Embodiment

Figure 2:
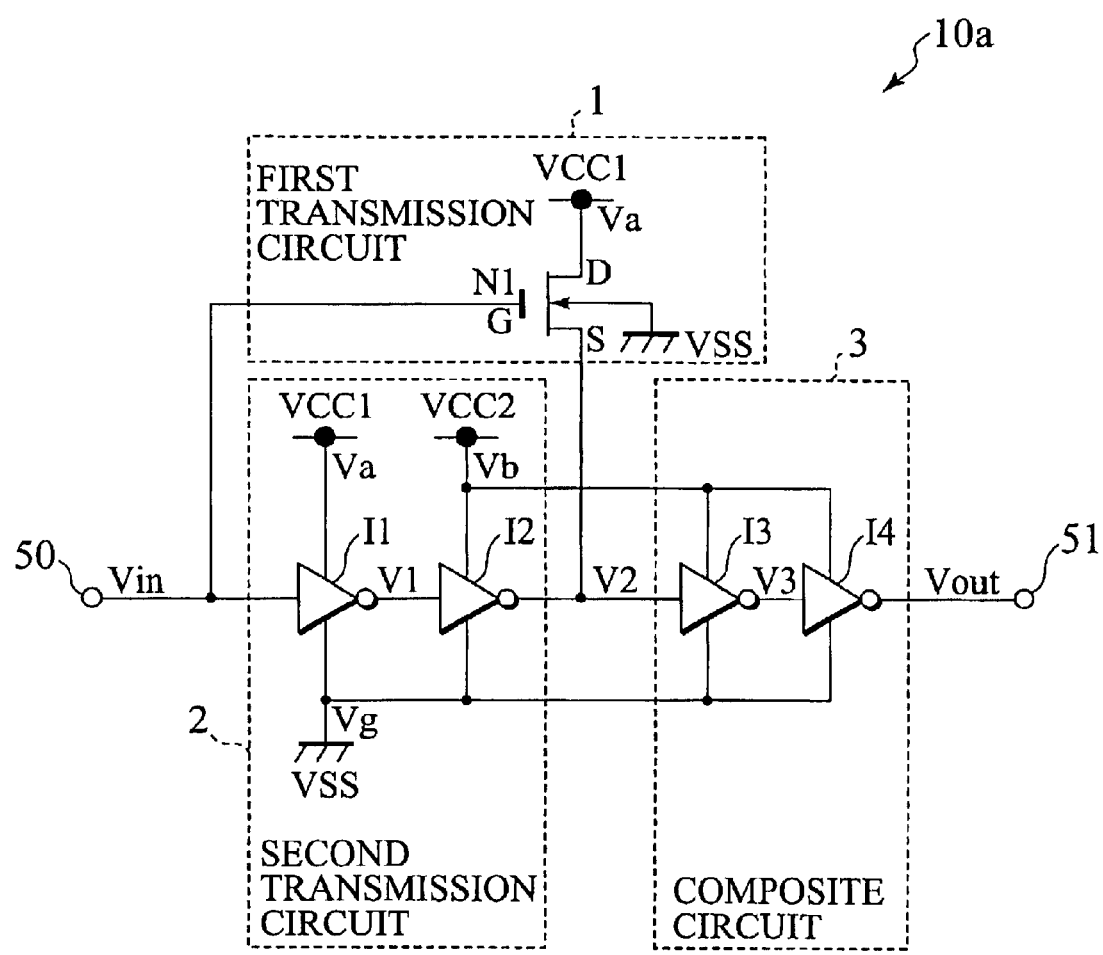
FIG. 2 is a circuit diagram of a level shift circuit according to a first embodiment of the present invention.

As shown in FIG. 2, a level shift circuit 10a according to a first embodiment of the present invention encompasses, a first transmission circuit 1 configured to transmit a leading edge of an input signal Vin, a second transmission circuit 2 configured to transmit a trailing edge of the input signal Vin, and a composite circuit 3 configured to generate an output signal Vout by synthesizing the leading edge and the trailing edge. The first transmission circuit 1 includes a nMOS transistor N1 having a gate terminal connected to a signal input terminal 50, a drain terminal connected to a first high voltage power supply VCC1, a back gate terminal connected to a low voltage power supply VSS, and a source terminal connected to an input side of the composite circuit 3.

The second transmission circuit 2 includes a first transmission inverter I1 having an input terminal connected to the signal input terminal 50, a high voltage power supply terminal connected to the first high voltage power supply VCC1, a low voltage power supply terminal connected to the low voltage power supply VSS, and a second transmission inverter I2 having input terminal connected to an output terminal of a first transmission inverter I1, a high voltage power supply terminal connected to the second high voltage power supply VCC2, a low voltage power supply terminal connected to the low voltage power supply VSS.

The composite circuit 3 includes a first composite inverter I3 and a second composite inverter I4. The first composite inverter I3 has an input terminal connected to output sides of the first transmission circuit 1 and the second transmission circuit 2, a high voltage power supply terminal connected to the second high voltage power supply VCC2, and a low voltage power supply terminal connected to the low voltage power supply VSS. The second composite inverter I4 has an input terminal connected to an output terminal of the first composite inverter I3, a high voltage power supply terminal connected to the second high voltage power supply VCC2, a low voltage power supply terminal connected to the low voltage power supply VSS, and an output terminal connected to a signal output terminal 51.

Figure 3:
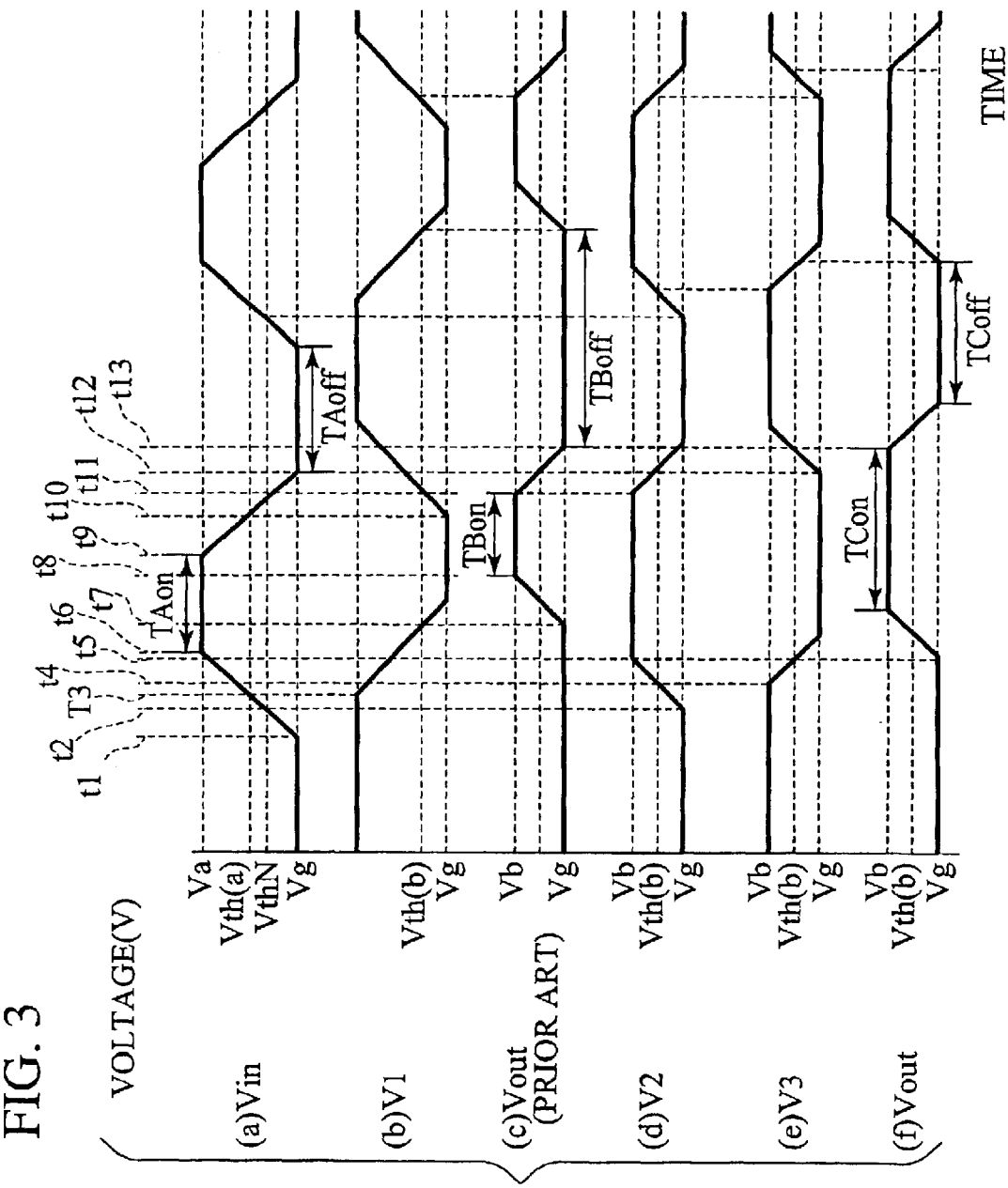
FIG. 3 is a diagram for describing the operational timing of the level shift circuit according to the first embodiment of the present invention.

Operation of the level shift circuit 10a according to the first embodiment of the present invention is described using the timing chart shown in FIG. 3.

(A) At time t1, as shown in FIG. 3(a), the voltage of the input signal Vin supplied to the signal input terminal 50 starts increasing from a low level to a high level.

(B) At time t2 when the voltage of the input signal Vin becomes larger than a threshold voltage VthN of the nMOS transistor N1, the nMOS transistor N1 turns on. As shown in FIG. 3(d), when the nMOS transistor N1 turns on, a second voltage V2 supplied from the nMOS transistor N1 starts increasing. In other words, the first transmission circuit 1 transmits the leading edge of the input signal Vin to the input side of the composite circuit 3. The input side of the composite circuit 3 is the input terminal of the first composite inverter I3.

(C) At time t3 when the voltage of the input signal Vin becomes larger than the threshold voltage Vth(a) of the first transmission inverter I1, as shown in FIG. 3(b), the first voltage V1 supplied from the first transmission inverter I1 starts decreasing.

(D) At time t4 when the second voltage V2 becomes larger than the threshold voltage Vth(b) of the first composite inverter I3, as shown in FIG. 3(e), a third voltage V3 supplied from the first composite inverter I3 starts decreasing.

(E) At time t5 when the third voltage V3 becomes smaller than the threshold voltage Vth(b) of the second composite inverter I4, as shown in FIG. 3(e), the output signal Vout supplied from the second composite inverter I4 starts increasing.

(F) At time t6, the voltage of the input signal Vin reaches a high level. The high level voltage of the input signal Vin is defined as the voltage Va supplied from the first high voltage power supply VCC1.

(G) At time t9 when the voltage of the input signal Vin starts decreasing from the high level to a low level.

(H) At time t10 when the voltage of the input signal Vin becomes smaller than the threshold voltage Vth(a) of the first transmission inverter I1, as shown in FIG. 3(b), the first voltage V1 supplied from the first transmission inverter I1 starts increasing.

(I) At time t11 when the first voltage V1 becomes larger than the threshold voltage Vth(b) of the second transmission inverter I2, as shown in FIG. 3(d), the second voltage V2 supplied from the second transmission inverter I2 starts decreasing.

(J) At time t12 when the second voltage V2 becomes smaller than the threshold voltage Vth(b) of the first composite inverter I3, as shown in FIG. 3(e), the third voltage V3 supplied from the first composite inverter I3 starts increasing.

(K) At time t13 when the third voltage V3 becomes larger than the threshold voltage Vth(b) of the second composite inverter I4, as shown in FIG. 3(f), the output signal Vout supplied from the second composite inverter I4 starts decreasing.

On the other hand, by the level shift circuit 200 according to a related art, at time t7 when the first voltage V1 becomes larger than the threshold voltage Vth(b) of the inverter 203 shown in FIG. 1A, the output signal Vout supplied from the inverter 203 starts increasing. At time t8, the output signal Vout arrives at the high level.

With the level shift circuit 10a according to the first embodiment of the present invention, a delay time of a leading edge generated by the level shift circuit 200 becomes small. As stated above, the first transmission circuit 1 transmits a leading edge faster so that the duty of the output signal Vout can be controlled.

Second Embodiment

Figure 4:
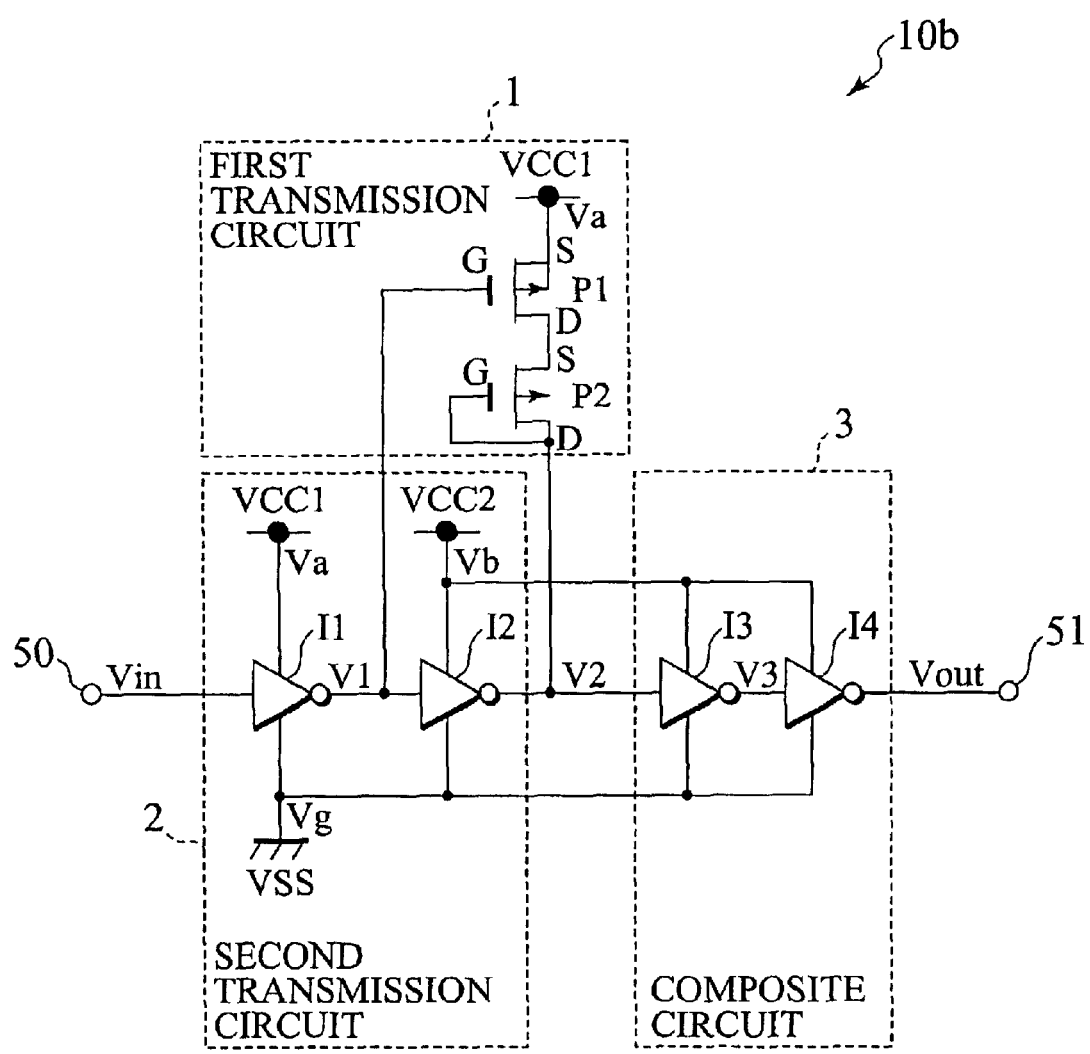
FIG. 4 is a circuit diagram of a level shift circuit according to a second embodiment of the present invention.

As shown in FIG. 4, in the first transmission circuit 1 used as part of a level shift circuit 10b according to a second embodiment, the nMOS transistor N1 shown in FIG. 2 is replaced with a pMOS transistor P1. The first transmission circuit 1 includes the pMOS transistor P1 and a first pMOS transistor P2. The pMOS transistor P1 has a gate terminal connected to the output terminal of the first transmission inverter I1, and a source terminal connected to the first high voltage power supply VCC1. The first pMOS transistor P2 used as a diode-connected between a drain terminal of the pMOS transistor P1 and the first input side of the composite circuit 3. The first pMOS transistor P2 has a drain terminal and a gate terminal connected to the first input side of composite circuit 3, and a source terminal connected to the drain terminal of the pMOS transistor P1. Other aspects are substantially similar to the first embodiment, and accordingly, redundant description is omitted.

In the first transmission circuit 1 used in the level shift circuit 10b according to the second embodiment of the present invention, the voltage of the input signal Vin supplied from the signal input terminal 50 starts increasing from a low level to a high level. When the voltage of the input signal Vin becomes larger than the threshold voltage Vth(a) of the first transmission inverter I1, the first voltage V1 supplied from the first transmission inverter I1 starts decreasing from the high level to the low level. When the first voltage V1 supplied from the first transmission inverter I1 becomes smaller than the threshold voltage VthP of the pMOS transistor P1, the pMOS transistor P1 turns on. When the pMOS transistor P1 turns on, a leading edge of the input signal Vin is transmitted to the input side of the first composite circuit 3.

With the level shift circuit 10b according to the second embodiment of the present invention, the delay time of the leading edge generated by the level shift circuit 200 becomes small. The duty of the output signal Vout can be controlled. In addition, when the pMOS transistor P1 turns on, the first pMOS transistor P2 works as a diode. Therefore, the voltage of the output signal Vout does not exceeded the voltage Vb. But, the voltage Vb is defined as smaller than the voltage Va. In other words, if the pMOS transistor P1 and the second transmission inverter I2 supply a high level signal simultaneously, the first pMOS transistor P2 can prevent flowing the current from the first high voltage power supply VCC1 to the second high voltage power supply VCC2.

Third Embodiment

Figure 5:
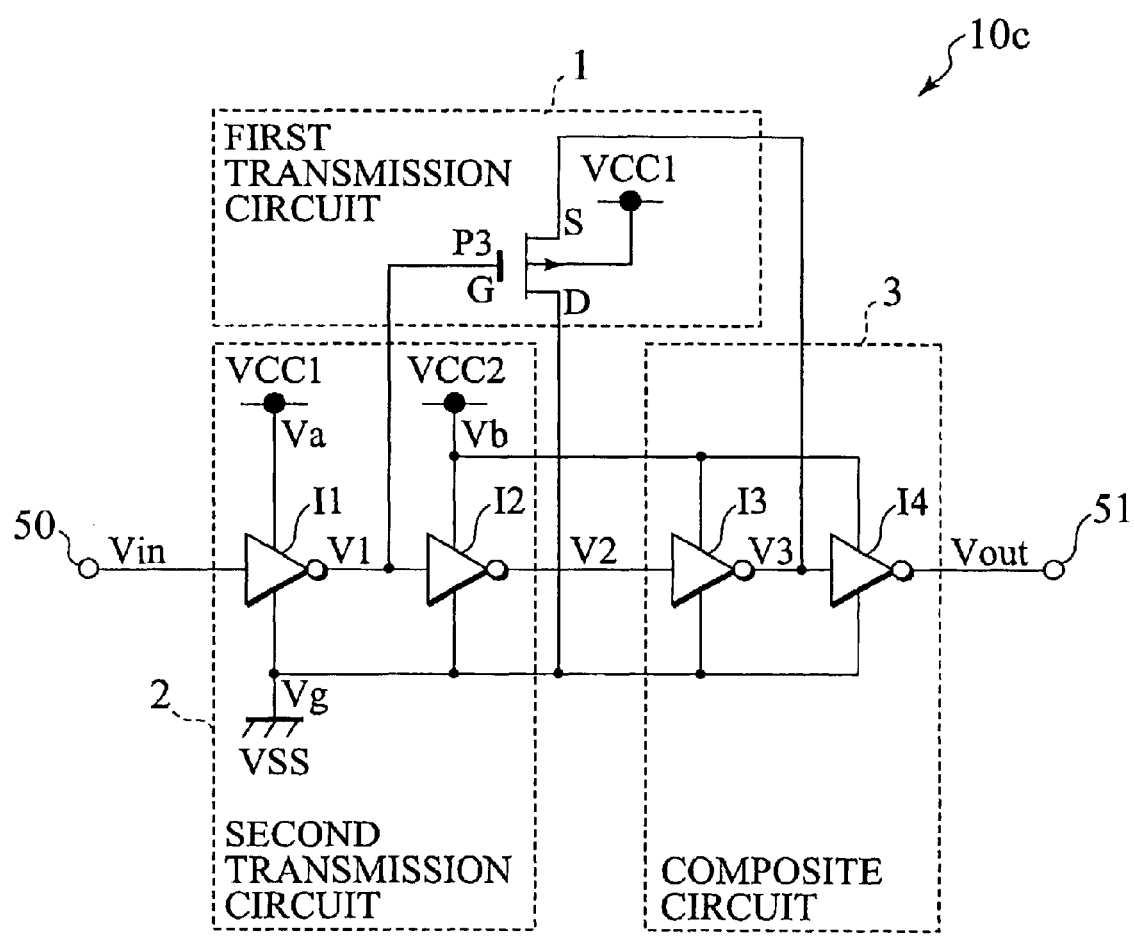
FIG. 5 is a circuit diagram of a level shift circuit according to a third embodiment of the present invention.

As shown in FIG. 5, in the first-transmission circuit 1 used as part of the level shift circuit 10c according to the third embodiment, the pMOS transistor P1 shown in FIG. 4 is replaced with a pMOS transistor P3. The first transmission circuit 1 includes the pMOS transistor P3. The pMOS transistor P3 has a back gate terminal the first high voltage power supply VCC1, a drain terminal connected to the low voltage power supply VSS, and a source terminal connected to the first input side of composite circuit 3. A back gate terminal of the pMOS transistor P3 is connected to the first high voltage power supply VCC1. Other aspects are substantially similar to the first embodiment, and accordingly, redundant description is omitted.

With the level shift circuit 10c according to the third embodiment of the present invention, the delay time of the leading edge generated by the level shift circuit 200 becomes small. The duty of the output signal Vout can be controlled. Furthermore, when the first pMOS transistor P2 shown in FIG. 4 is not present, the level shift circuit 10c according to a third embodiment can prevent flowing the current from the first high voltage power supply VCC1 to the second high voltage power supply VCC2.

Fourth Embodiment

Figure 6:
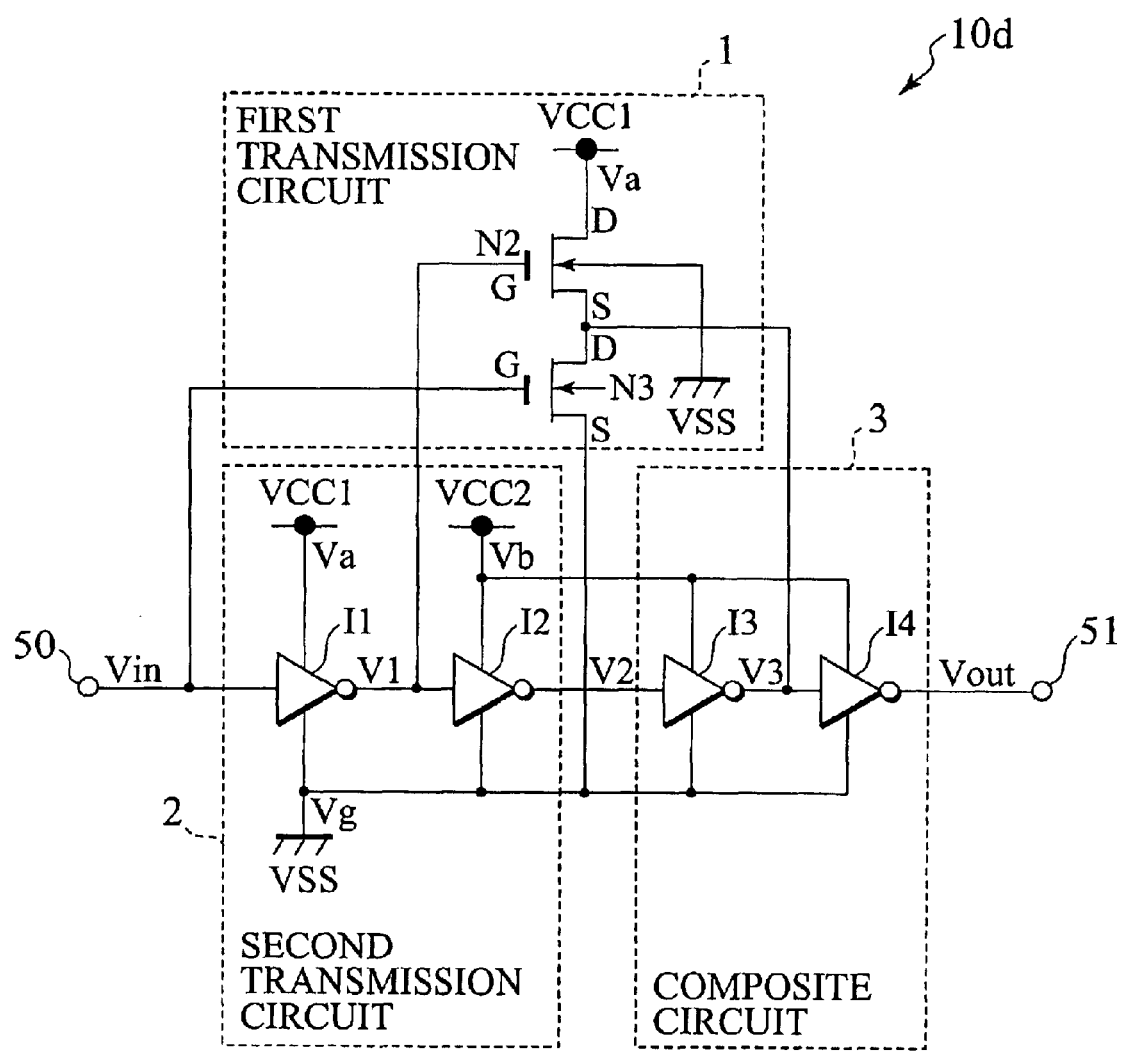
FIG. 6 is a circuit diagram of a level shift circuit according to a fourth embodiment of the present invention.

As shown in FIG. 6, in the first transmission circuit 1 used as part of the level shift circuit 10d according to a fourth embodiment, the nMOS transistor N1 shown in FIG. 2 is replaced with a first nMOS transistor N2 and a second nMOS transistor N3. The first transmission circuit 1 includes the first nMOS transistor N2, and the second nMOS transistor N3. The first nMOS transistor N2 has a drain terminal connected to the first high voltage power supply VCC1, and a gate terminal connected to a inversion terminal of the second transmission circuit 2. The second nMOS transistor N3 has a drain terminal connected to a source terminal of the first nMOS transistor N2, a gate terminal connected to the input terminal 50, and a source terminal connected to the low voltage power supply VSS. The gate terminal of the first nMOS transistor N2 is connected to the output terminal of the first transmission inverter I1. The connection point of the first nMOS transistor N2 and second nMOS transistor N3 is connected to the output terminal of the first composite inverter I3. A back gate terminal of the first nMOS transistor N2 is connected to the low voltage power supply VSS. The other aspects are substantially similar to the first embodiment, and accordingly, redundant description is omitted.

In the first transmission circuit 1 used in the level shift circuit 10d according to the fourth embodiment of the present invention, the first nMOS transistor N2 and the second nMOS transistor N3 turns on depending on the voltage level of the input signal Vin, alternately. When the first nMOS transistor N2 turns on, a voltage Va is supplied to the input terminal of the second composite inverter I4. In other words, the leading edge of the input signal Vin is transmitted to the input side of the composite circuit 3. When the second nMOS transistor N3 turns on, the voltage of the input terminal of the second composite inverter I4 becomes a voltage Vg of the low voltage power supply.

With the level shift circuit 10d according to the fourth embodiment of the present invention, the delay time of the leading edge generated by the level shift circuit 200 becomes small. The duty of the output signal Vout can be controlled.

Fifth Embodiment

Figure 7:
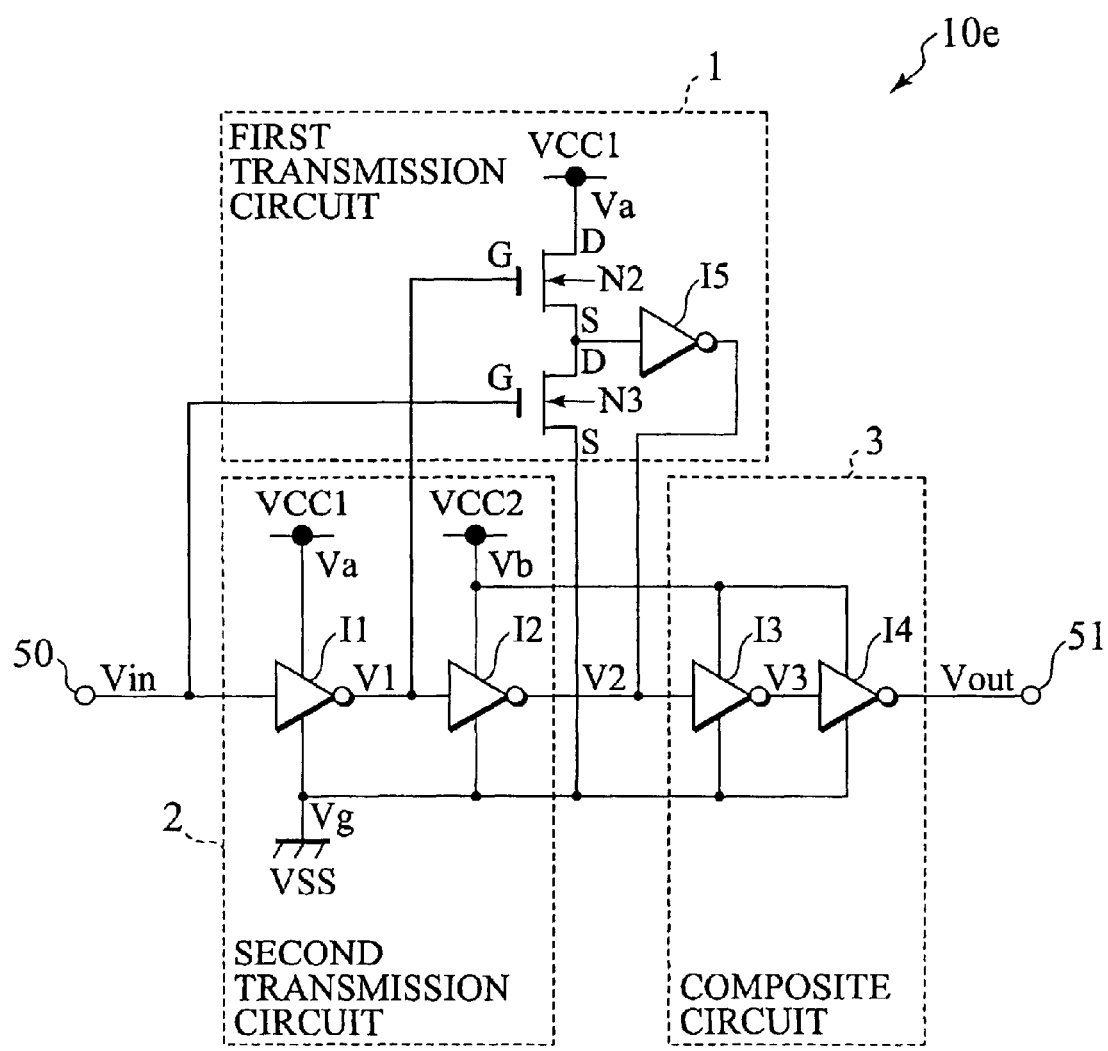
FIG. 7 is a circuit diagram of a level shift circuit according to a fifth embodiment of the present invention.

As shown in FIG. 7, in the first transmission circuit 1 used as part of the level shift circuit 10e according to a fifth embodiment, an inverter I5 is added to the first transmission circuit 1 shown in FIG. 6. The first transmission circuit 1 includes the first nMOS transistor N2, the second nMOS transistor N3, and the inverter I5. The first nMOS transistor N2 has the drain terminal connected to the first high voltage power supply VCC1, and the gate terminal connected to the inversion terminal of the second transmission circuit 2. The second nMOS transistor N3 has the drain terminal connected to the source terminal of the first nMOS transistor N2, the gate terminal connected to input terminal 50, and the source terminal connected to the low voltage power supply VSS. The inverter I5 has an input terminal connected to a connection point with the first nMOS transistor N2 and the second nMOS transistor N3, and an output terminal connected to the input side of the composite circuit 3. The output terminal of the inverter I5 is connected to the input terminal of the first composite inverter I3. Other aspects are substantially similar to the first embodiment, and accordingly, redundant description is omitted.

In the first transmission circuit 1 used in the level shift circuit 10e according to the fifth embodiment of the present invention, the first nMOS transistor N2 and the second nMOS transistor N3 turn on depending on the voltage level of input signal Vin, alternately. When the first nMOS transistor N2 turns on, a voltage Va is supplied to the input terminal of the inverter I5. In other words, the leading edge of the input signal Vin is transmitted to input side of the composite circuit 3. When the second nMOS transistor N3 turns on, the voltage supplied to the input terminal of the inverter I5 becomes the voltage Vg of the low voltage power supply VSS. The leading edge of the input signal Vin is transmitted to the input terminal of the first composite inverter I3 from the output terminal of the inverter I5.

With the level shift circuit 10e according to the fifth embodiment of the present invention, the delay time of the leading edge generated by the level shift circuit 200 becomes small. The duty of the output signal Vout can be controlled.

Sixth Embodiment

Figure 8:
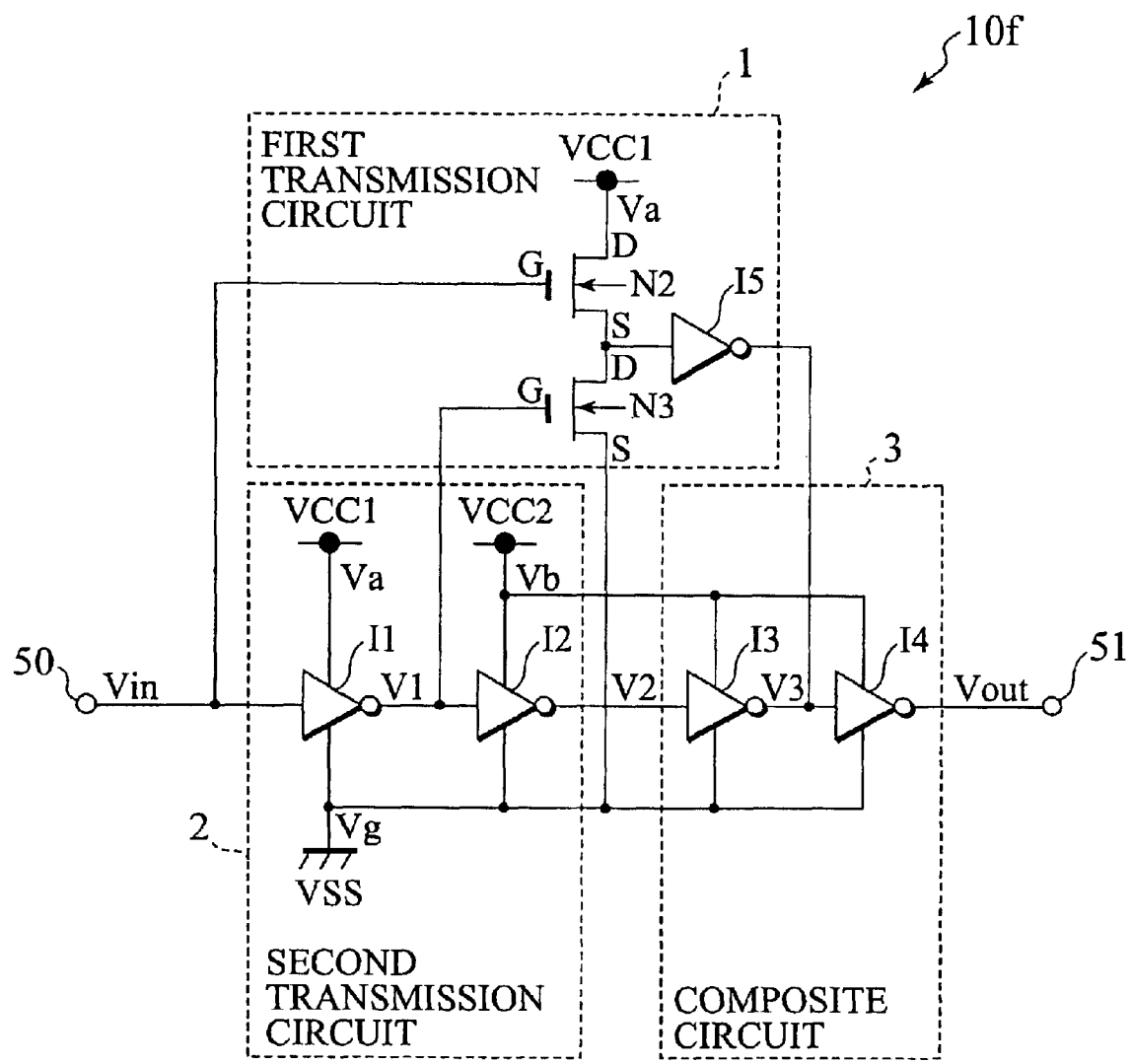
FIG. 8 is a circuit diagram of a level shift circuit according to a sixth embodiment of the present invention.

As shown in FIG. 8, in the first transmission circuit 1 used as part of a level shift circuit 10f according to a sixth embodiment, a connection point of the gate terminal of the second nMOS transistor N3 showed in FIG. 7 is replaced with a connection point of the gate terminal of the first nMOS transistor N2. The first transmission circuit 1 includes the first nMOS transistor N2 and the second nMOS transistor N3 and the inverter I5. The first nMOS transistor N2 has the drain terminal connected to the first high voltage power supply VCC1, and the gate terminal connected to input terminal 50. The second nMOS transistor N3 has the drain terminal connected to the source terminal of the first nMOS transistor N2, the gate terminal connected to the inversion terminal of the second transmission circuit 2, and the source terminal connected to low voltage power supply VSS. The inverter I5 has the input terminal connected to the connection point with the first nMOS transistor N2 and the second nMOS transistor N3, the output terminal connected to the first input terminal of composite circuit 3. The output terminal of the inverter I5 is connected to the output terminal of the first composite inverter I3. The other aspects are substantially similar to the first embodiment, and accordingly, redundant description is omitted.

In the first transmission circuit 1 used in the level shift circuit 10f according to the sixth embodiment of the present invention, the first nMOS transistor N2 and the second nMOS transistor N3 turn on depending on the level of input signal Vin, alternately. When the first nMOS transistor N2 turns on, the first high supply voltage Va is supplied to the input terminal of the inverter I5. In other words, the leading edge of the input signal Vin is transmitted to composite circuit 3. When the second nMOS transistor N3 turns on, the voltage supplied to the input terminal of the inverter I5 becomes the voltage Vg of the low voltage power supply VSS. The leading edge of the input signal Vin is transmitted to the output terminal of the first composite inverter I3 from the output of the inverter I5.

With the level shift circuit 10f according to the sixth embodiment of the present invention, the delay time of the leading edge generated by the level shift circuit 200 becomes small. The duty of the output signal Vout can be controlled.

Seventh Embodiment

Figure 9:
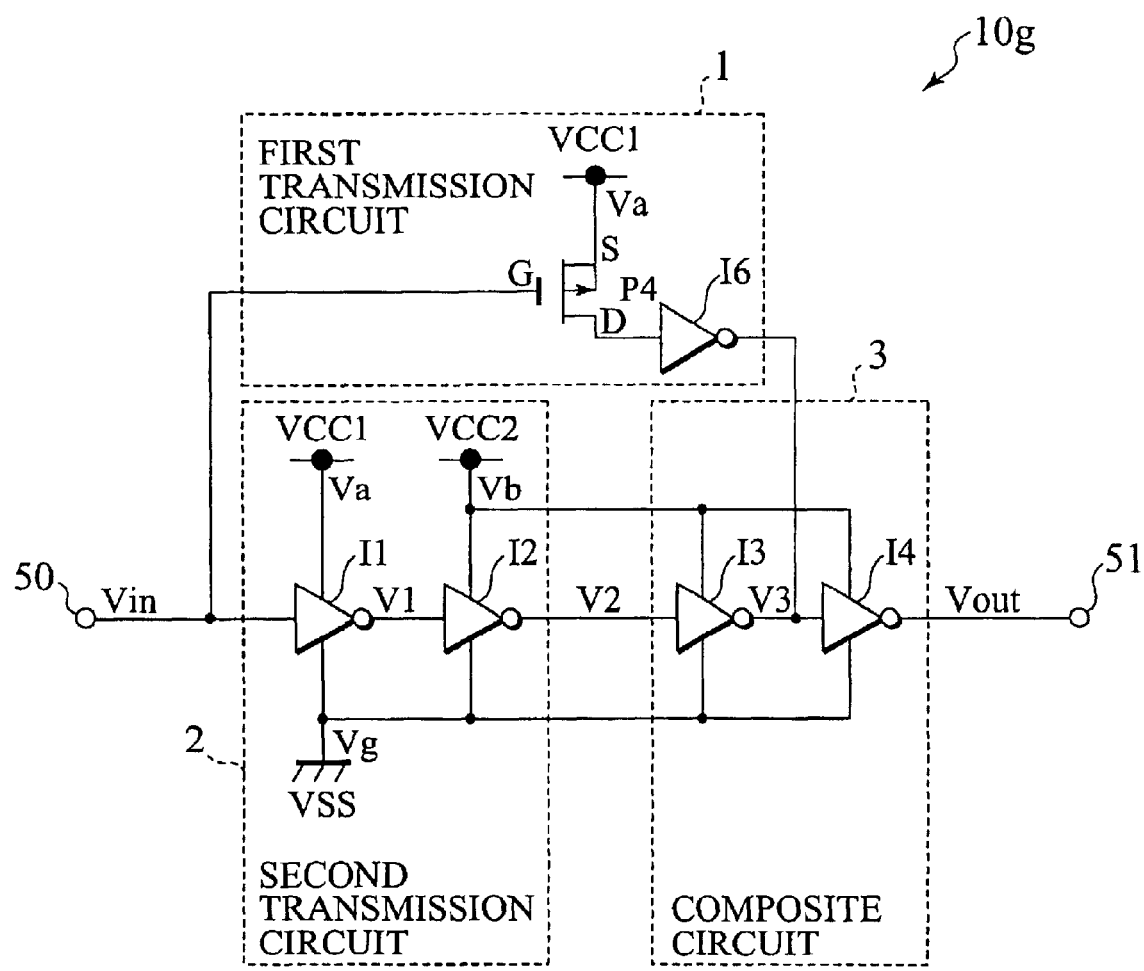
FIG. 9 is a circuit diagram of a level shift circuit according to a seventh embodiment of the present invention.

As shown in FIG. 9, in the first transmission circuit 1 used as part of the level shift circuit 10g according to a seventh embodiment, the nMOS transistor N1 shown in FIG. 2 is replaced with a pMOS transistor P4 and an inverter I6. The first transmission circuit 1 includes the pMOS transistor P4 and the inverter I6. The pMOS transistor P4 has a source terminal connected to the first high voltage power supply VCC1, and a gate terminal connected to input terminal 50. The inverter I6 has an input terminal connected to a drain terminal of the pMOS transistor P4, and an output terminal connected to a first input terminal of composite circuit 3. The output terminal of the inverter I6 is connected to the input terminal of the second composite inverter I4. Other aspects are substantially similar to the first embodiment, and accordingly, redundant description is omitted.

With the level shift circuit 10g according to the seventh embodiment of the present invention, the delay time of the leading edge generated by the level shift circuit 200 becomes small. The duty of the output signal Vout can be controlled.

Eighth Embodiment

Figure 10:
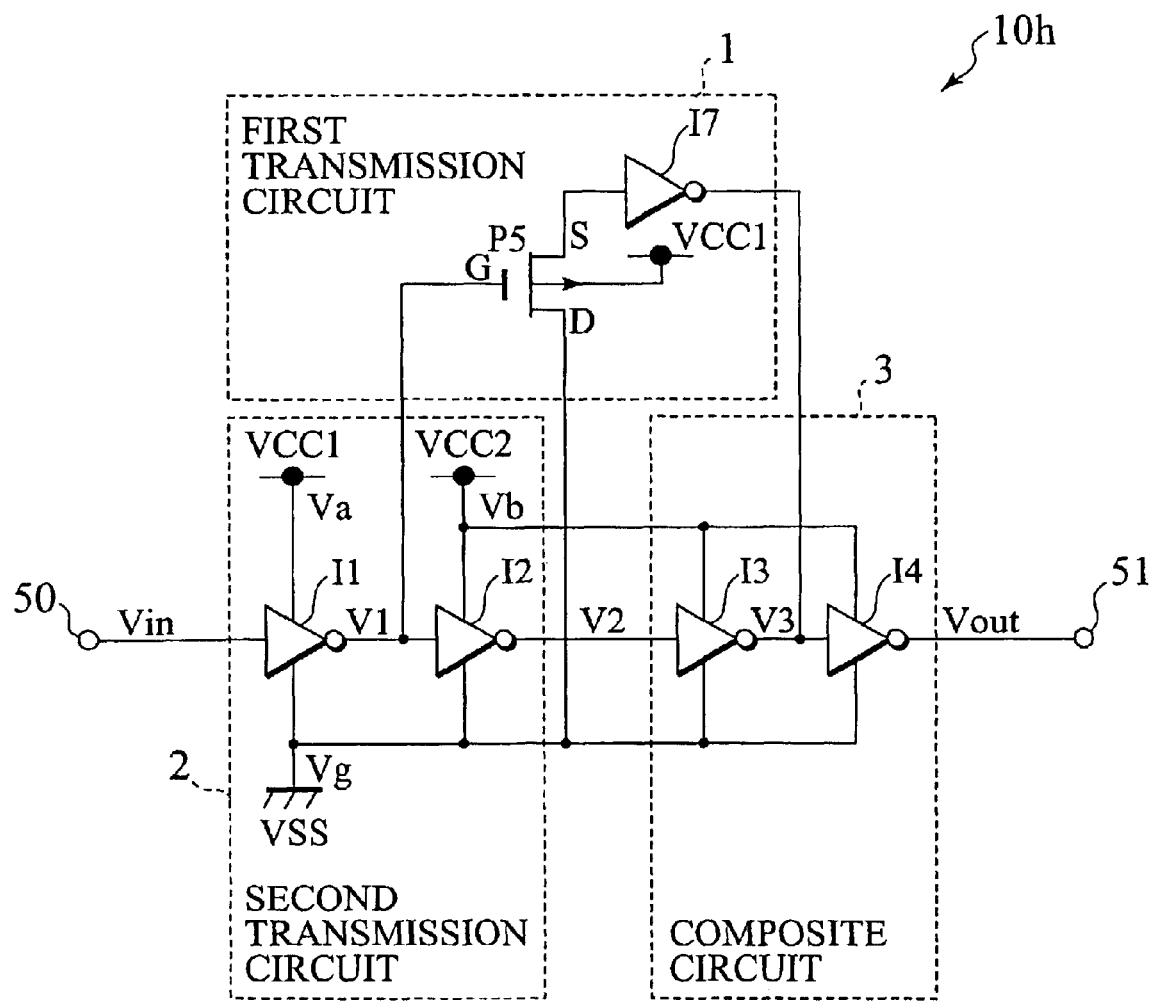
FIG. 10 is a circuit diagram of a level shift circuit according to a eighth embodiment of the present invention.

As shown in FIG. 10, in the first transmission circuit 1 used as part of the level shift 10h circuit according to a eighth embodiment, the pMOS transistor P4 shown in FIG. 9 is replaced with the pMOS transistor P5. The first transmission circuit 1 includes a pMOS transistor P5 and an inverter I7. The pMOS transistor P5 has a gate terminal connected to a inversion terminal of the second transmission circuit 2, and a drain terminal connected to the low voltage power supply VSS. The inverter I7 has an input terminal connected to a source terminal of the pMOS transistor P5, and the output terminal connected to the input side of the composite circuit 3. Other aspects are substantially similar to the first embodiment, and accordingly, redundant description is omitted.

With the level shift circuit 10g according to the eighth embodiment of the present invention, the delay time of the leading edge generated by the level shift circuit 200 becomes small. The duty of the output signal Vout can be controlled.

Ninth Embodiment

Figure 11:
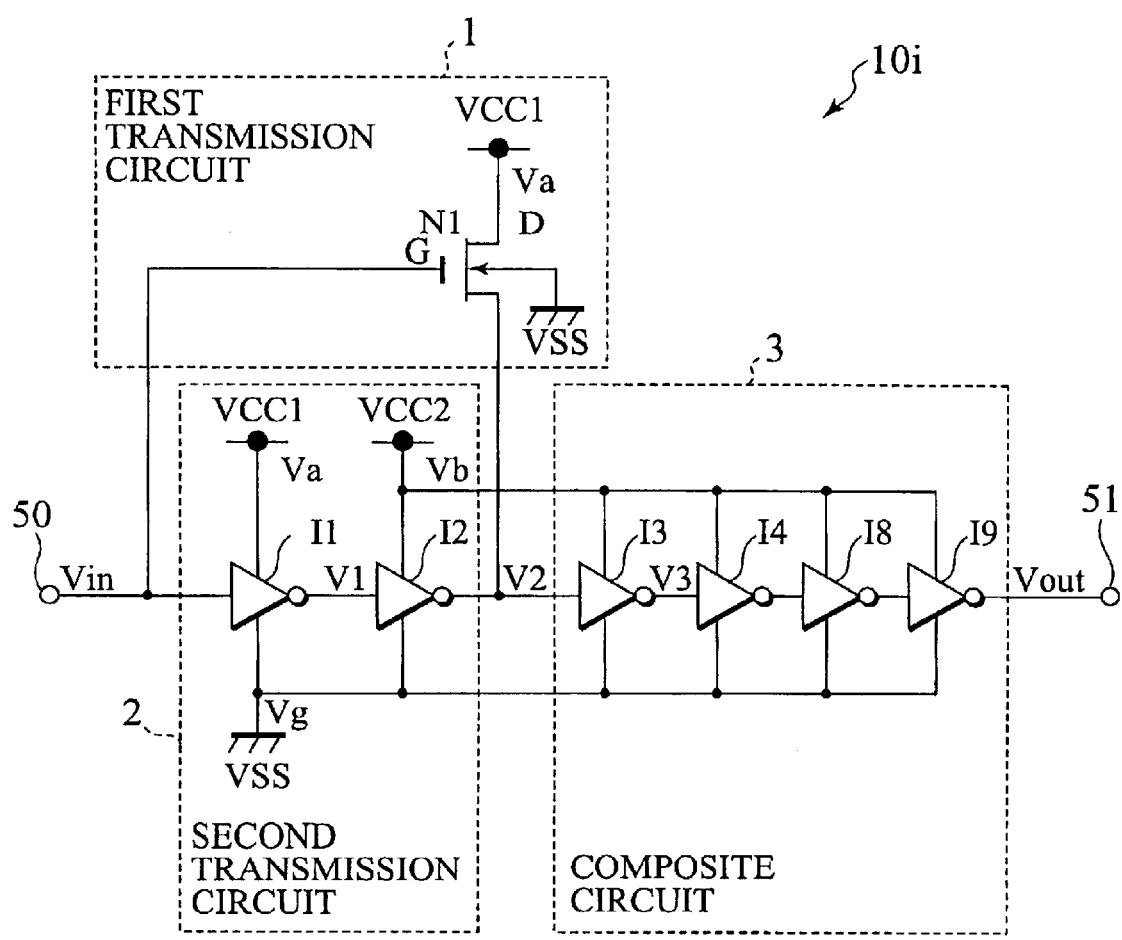
FIG. 11 is a circuit diagram of a level shift circuit according to a ninth embodiment of the present invention.

As shown in FIG. 11, in the first transmission circuit 1 used as part of a level shift circuit 10i according to a ninth embodiment, the composite circuit 3 shown in FIG. 2 is added to a plurality of inverters connected in series. Other aspects are substantially similar to the first embodiment, and accordingly, redundant description is omitted.

With the level shift circuit 10i according to the ninth embodiment of the present invention, the delay time of the leading edge generated by the level shift circuit 200 becomes small. The duty of the output signal Vout can be controlled. Furthermore, the level shift circuit 10i according to the ninth embodiment can adjust the duty of the output signal Vout.

Various modifications will become possible for those skilled in the art after receiving the teachings of the present disclosure without departing from the scope thereof.

What is claimed is:

1. A level shift circuit comprising:
   a first transmission circuit configured to transmit a leading edge of an input signal and connected to a first high voltage supply;
   a second transmission circuit configured to transmit a trailing edge of the input signal and connected to the first high voltage power supply and a second high voltage power supply smaller than the first high voltage power; and
   a composite circuit configured to generate an output signal by synthesizing the leading edge and the trailing edge.

2. The level shift circuit of claim 1, wherein the first transmission circuit includes a nMOS transistor having a gate terminal configured to receive the input signal, a drain terminal connected to the first high voltage power supply, a source terminal connected to an input side of the composite circuit.

3. The level shift circuit of claim 2, wherein the nMOS transistor has a back gate terminal connected to a low voltage power supply.

4. The level shift circuit of claim 1, wherein the first transmission circuit includes:
   a pMOS transistor having a gate terminal configured to receive an inversion signal of the input signal, a source terminal connected to the first high voltage power supply; and
   a first pMOS transistor serving as a diode connected between a drain terminal of the pMOS transistor and a first input side of the composite circuit.

5. The level shift circuit of claim 4, wherein the first pMOS transistor has:
   a drain terminal and a gate terminal connected to the first input side of the composite circuit; and
   a source terminal connected to the drain terminal of the pMOS transistor.

6. The level shift circuit of claim 4, wherein the pMOS transistor has a back gate terminal connected to the first high voltage power supply.

7. The level shift circuit of claim 1, wherein the first transmission circuit includes a pMOS transistor having a gate terminal configured to receive a inversion signal of the input signal, a drain terminal connected to a low voltage power supply, and a source terminal connected to a first input side of the composite circuit.

8. The level shift circuit of claim 7, wherein the pMOS transistor has a back gate terminal connected to the first high voltage power supply.

9. The level shift circuit of claim 1, wherein the first transmission circuit includes:
   a first nMOS transistor having a drain terminal connected to the first high voltage power supply, a gate terminal configured to receive a inversion signal of the input signal; and
   a second nMOS transistor having a drain terminal connected to a source terminal of the first nMOS transistor, a gate terminal configured to receive the input signal, a source terminal connected to a low voltage power supply.

10. The level shift circuit of claim 9, wherein the first nMOS transistor has a back gate terminal connected to the low voltage power supply.

11. The level shift circuit of claim 1, wherein the first transmission circuit includes:
   a first nMOS transistor having a drain terminal connected to the first high voltage power supply, a gate terminal configured to receive a inversion signal of the input signal;
   a second nMOS transistor having a drain terminal connected to a source terminal of the first nMOS transistor, a gate terminal configured to receive the input signal, a source terminal connected to a low voltage power supply; and an inverter having an input terminal connected to a connection point with the first nMOS transistor and the second nMOS transistor, an output terminal connected to a first input terminal of the composite circuit.

12. The level shift circuit of claim 1, wherein the first transmission circuit includes:

a first nMOS transistor having a drain terminal connected to the first high voltage power supply, a gate terminal configured to receive the input signal;

a second nMOS transistor having a drain terminal connected to a source terminal of the first nMOS transistor, a gate terminal configured to receive a inversion signal of the input signal, a source terminal connected to a low voltage power supply; and an inverter having an input terminal connected to a connection point with the first nMOS transistor and the second nMOS transistor, an output terminal connected to the first input terminal of the composite circuit.

13. The level shift circuit of claim 1, wherein the first transmission circuit includes:

a pMOS transistor having a gate terminal configured to receive the input signal, a source terminal connected to the first high voltage power supply, a drain terminal transmits a inversion signal of the input signal to the composite circuit; and an inverter having an input terminal connected to the drain terminal of the pMOS transistor, and an output terminal connected to a first input terminal of the composite circuit.

14. The level shift circuit of claim 13, wherein the pMOS transistor has a back gate terminal connected to the first high voltage power supply.

15. The level shift circuit of claim 1, wherein the first transmission circuit includes:

a pMOS transistor having a gate terminal connected to a inversion terminal of the second transmission circuit, a drain terminal connected to a low voltage power supply; and an inverter having an input terminal connected to a source terminal of the pMOS transistor, an output terminal connected to a first input terminal of the composite circuit.

16. The level shift circuit of claim 15, wherein the pMOS transistor has a back gate terminal connected to the first high voltage power supply.

17. The level shift circuit of claim 1, wherein the first transmission circuit includes a pMOS transistor having a gate terminal configured to receive a inversion signal of the input signal, a back gate terminal connected to the first high voltage power supply, and a drain terminal connected to a low voltage power supply, a source terminal connected to a first output side of the composite circuit.

18. The level shift circuit of claim 1, wherein the second transmission circuit includes:

a first transmission inverter having an input terminal configured to receive an input signal, a high voltage power supply terminal connected to the first high voltage power supply; and a second transmission inverter having an input terminal connected to an output terminal of the first transmission inverter, a high voltage power supply terminal connected to the second high voltage power supply smaller than the first high voltage power supply.

19. The level shift circuit of claim 1, wherein the composite circuit has a node connected to a connection point with an output terminal of the first transmission circuit and an output terminal of the second transmission circuit.

20. The level shift circuit of claim 1, wherein the composite circuit has a node connected to an output terminal of the first transmission circuit and another node connected to an output terminal of the second transmission circuit.

* * * * *